(12) United States Patent
Oota

(10) Patent No.: US 9,449,893 B2
(45) Date of Patent: Sep. 20, 2016

(54) SEMICONDUCTOR MODULE

(75) Inventor: Shinsuke Oota, Kariya (JP)

(73) Assignee: DENSO CORPORATION, Kariya (JP)

( * ) Notice: Subject to any disclaimer, the term of this patent is extended or adjusted under 35 U.S.C. 154(b) by 84 days.

(21) Appl. No.: 13/607,872

(22) Filed: Sep. 10, 2012

(65) Prior Publication Data
US 2012/0326295 A1 Dec. 27, 2012

Related U.S. Application Data

(62) Division of application No. 12/834,941, filed on Jul. 13, 2010, now abandoned.

(30) Foreign Application Priority Data

Jul. 14, 2009 (JP) ................. 2009-165711

(51) Int. Cl.
*H01L 29/10* (2006.01)
*H01L 23/36* (2006.01)
(Continued)

(52) U.S. Cl.
CPC ............ *H01L 23/36* (2013.01); *H01L 23/047* (2013.01); *H01L 23/4334* (2013.01); *H01L 23/49562* (2013.01); *H01L 25/115* (2013.01); *H01L 2924/0002* (2013.01)

(58) Field of Classification Search
CPC ........................ H01L 21/4871–21/4882; H01L 23/36–23/3677; H01L 31/052; H01L 2023/4037–2023/4068; H01L 23/49568–23/49582; H01L 2224/06519; H01L 2224/14519; H01L 2224/17519; H01L 2224/30519; H01L 2224/33519
USPC ....... 257/276, 625, 664–677, 706, 717, 720, 257/722, 796, E23.101, E23.103, E23.105; 361/679.47, 679.54, 697, 702, 709
See application file for complete search history.

(56) References Cited

U.S. PATENT DOCUMENTS 5,581,118 A    12/1996   Mays
5,661,902 A *   9/1997   Katchmar ....................... 29/840
(Continued)

FOREIGN PATENT DOCUMENTS

JP        H1-101655       4/1989
JP        U-H3-101542     10/1991
(Continued)

OTHER PUBLICATIONS

Korean Official Action dated Nov. 30, 2012, issued in corresponding Korean Application No. 10-2010-67263, with English translation.
(Continued)

*Primary Examiner* — Cuong B Nguyen
(74) *Attorney, Agent, or Firm* — Nixon & Vanderhye P.C.

(57) ABSTRACT

A semiconductor module includes a semiconductor chip having a switching function, a resin portion that covers the chip, terminals, and a heat dissipation portion. The resin portion includes first and second surfaces, which are opposed to each other and expand generally parallel to an imaginary plane; and a substrate is located on a first surface-side of the resin portion. The terminals project from the resin portion in a direction of the imaginary plane and are soldered onto the substrate. The heat dissipation portion is disposed on a second surface-side of the resin portion to release heat generated in the chip. One of the terminals is connected to the heat dissipation portion such that heat is transmitted from the one of the terminals to the heat dissipation portion.

6 Claims, 15 Drawing Sheets

(51) Int. Cl.
*H01L 23/047* (2006.01)
*H01L 23/433* (2006.01)
*H01L 23/495* (2006.01)
*H01L 25/11* (2006.01)

(56) References Cited

U.S. PATENT DOCUMENTS

| | | | |
|---|---|---|---|
| 5,770,300 A * | 6/1998 | Okamoto et al. | 428/209 |
| 6,552,421 B2 | 4/2003 | Kishimoto et al. | |
| 2001/0050843 A1 | 12/2001 | Ueno et al. | |
| 2004/0080028 A1* | 4/2004 | Yanagisawa | 257/675 |
| 2006/0076674 A1* | 4/2006 | Takaishi | 257/712 |
| 2007/0216013 A1* | 9/2007 | Funakoshi et al. | 257/691 |
| 2007/0259514 A1* | 11/2007 | Otremba | 438/612 |
| 2009/0001559 A1 | 1/2009 | Satou et al. | |
| 2011/0012256 A1 | 1/2011 | Oota | |

FOREIGN PATENT DOCUMENTS

| | | |
|---|---|---|
| JP | H9-22970 | 1/1997 |
| JP | 2611671 | 2/1997 |
| JP | 2684893 | 8/1997 |
| JP | 2685039 | 8/1997 |
| JP | 2828358 | 9/1998 |
| JP | 2003-023126 | 1/2003 |
| JP | P2005-159238 A | 6/2005 |

OTHER PUBLICATIONS

Japanese Action dated May 11, 2012, issued in corresponding Japanese Application No. 2009-165711 with English Translation.
Chinese Office Action dated Apr. 23, 2012, issued in corresponding Chinese Application No. 201010229249.1 with English Translation.
Korean Office Action dated Apr. 26, 2012, issued in corresponding Korean Application No. 10-2010-0067263 with English Translation.
Korean Office Action dated Sep. 30, 2011, issued in corresponding Korean Application No. 10-2010-67263 with English Translation.
Japanese Office Action dated Aug. 5, 2011, issued in corresponding Japanese Application No. 2009-165711 with English Translation.
Japanese Decisions dated Sep. 7, 2012, issued in corresponding Japanese Application No. 2009-165711 with English Translations.
Office Action (3 pages) dated Jan. 31, 2013 issued in corresponding Korean Application No. 10-2010-67263 and English translation (3 pages).

* cited by examiner

SEMICONDUCTOR MODULE

CROSS REFERENCE TO RELATED APPLICATION

This application is a Division of application Ser. No. 12/834,941, filed Jul. 13, 2010, which claims priority from Japanese Patent Application No. 2009-165711 filed on Jul. 14, 2009, the contents of each of which are incorporated herein by reference.

BACKGROUND OF THE INVENTION

1. Field of the Invention

The present invention relates to a semiconductor module having a switching function for rotating a motor.

2. Description of Related Art

Motor control for a vehicle progresses further and further each year, and an electronic control unit (ECU) that is responsible for a motor and control of the motor is on the increase. On the other hand, to provide a comfortable space for a user of the vehicle, attempts are made to expand a space in a passenger compartment of the vehicle. Accordingly, it is a challenge to ensure a space for arrangement of the motor and ECU, and downsizing of the motor and ECU is becoming important.

For example, an ECU, which is used for an electric power steering system (hereinafter referred to as an EPS), is disposed behind an engine compartment or instrument panel. However, because the ECU used for the EPS drives the motor with a high current (about 100 A), heat generation of its switching element becomes great. For this reason, in order to downsize such an ECU, its structure for high heat dissipation is necessary. In this regard, a semiconductor module having a heat sink on an upper surface a semiconductor chip is proposed (see, for example, Japanese Patent No. 2685039).

Nevertheless, a semiconductor module described in the above U.S. Pat. No. 2,685,039 may not be necessarily adequate from the aspect of the heat dissipation.

SUMMARY OF THE INVENTION

The present invention addresses at least one of the above disadvantages.

According to the present invention, there is provided a semiconductor module adapted to be packaged on a substrate. The semiconductor module includes a semiconductor chip, a resin portion, a plurality of terminals, and a heat dissipation portion. The semiconductor chip has a switching function. The resin portion is formed to cover the semiconductor chip. The resin portion includes a first surface and a second surface, which are opposed to each other and expand generally parallel to an imaginary plane. The substrate is located on a first surface-side of the resin portion. The plurality of terminals project from the resin portion in a direction of the imaginary plane and are soldered onto the substrate. The heat dissipation portion is disposed on a second surface-side of the resin portion to release heat generated in the semiconductor chip. One of the plurality of terminals is connected to the heat dissipation portion such that heat is transmitted from the one of the plurality of terminals to the heat dissipation portion.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Embodiments of the invention will be described below.

First Embodiment

An electronic control unit (ECU) of a first embodiment controls a motor used for an electric power steering system (EPS). This ECU is characterized in that the ECU includes a semiconductor module which serves as a switch for switching between turning on and off of an electric current supplied to the motor. Since a high current is supplied to the motor, the ECU has a problem of heat generation of the semiconductor module.

Figure 1:
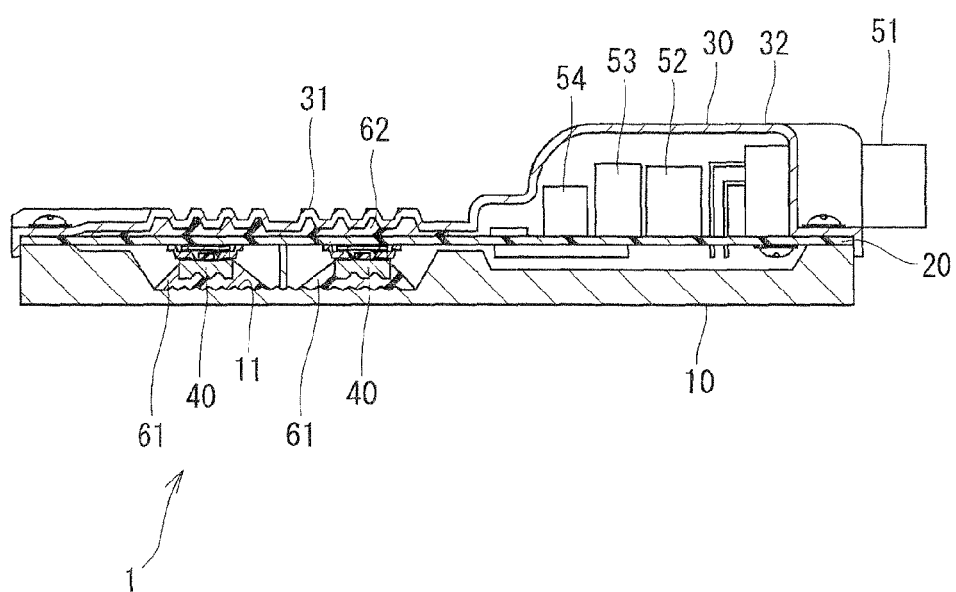
FIG. 1 is a cross-sectional view roughly illustrating an electronic control unit (ECU) in accordance with a first embodiment of the invention.

As illustrated in FIG. 1, an exterior portion of an ECU 1 includes a heat sink 10 serving as a bottom portion of the ECU 1, and a cover 30 covering a substrate 20 from above the substrate 20.

Figure 2:
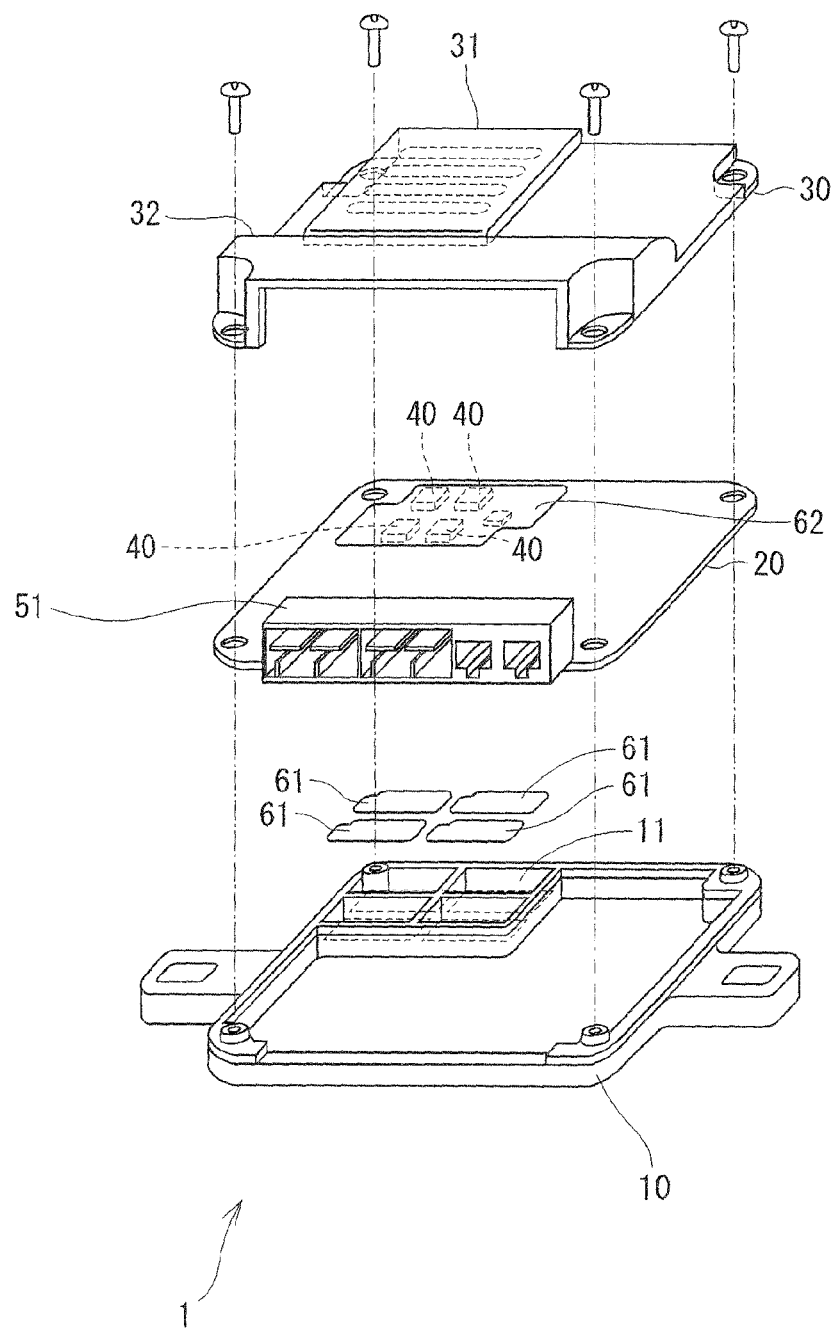
FIG. 2 is a perspective exploded view illustrating the ECU in accordance with the first embodiment.

As illustrated in FIG. 2, the heat sink 10 has a generally rectangular shape, and includes a recess 11 near its one corner. Four semiconductor modules 40 are accommodated and disposed in the recess 11.

Similar to the heat sink 10, the substrate 20 has a rectangular shape, and the four semiconductor modules 40 are packaged on a part of an undersurface of the substrate 20 that corresponds to the recess 11 of the heat sink 10. In FIG. 2, the semiconductor modules 40 are packaged on the undersurface of a rear corner of the substrate 20. A connector 51 is packaged on one side of the substrate 20 to project toward a lateral side of the substrate 20. In FIG. 2, the connector 51 is packaged on the one side of the substrate 20 in the front of the substrate 20 away from the semiconductor modules 40.

As illustrated in FIG. 1, a relay 52, a coil 53, and an aluminum electrolytic capacitor 54 are arranged further on the substrate 20 in the connector 51. These electronic components 52 to 54 are not shown in FIG. 2.

The cover 30 includes a heat dissipation portion 31 that has a corrugated shape in cross section and that corresponds to the corner portion of the substrate 20 on which the semiconductor modules 40 are packaged. Because of such a corrugated shape, a surface area of the heat dissipation portion 31 is made large to contribute to heat dissipation. Furthermore, strain of the cover 30 is also limited. The cover 30 includes an accommodating portion 32 for accommodating the electronic components 51 to 54 on its connector 51-side.

As illustrated in FIG. 2, the heat sink 10 and the cover 30 are screwed together with the substrate 20 between the heat sink 10 and the cover 30. When the heat sink 10 and the cover 30 are screwed together, heat dissipation gels 61 are provided for the recess 11 of the heat sink 10. As a result, a surrounding area of the semiconductor module 40 is filled with the heat dissipation gel 61. Likewise, a heat dissipation gel 62 is also provided under the heat dissipation portion 31 of the cover 30. Accordingly, a space between the heat dissipation portion 31 and the substrate 20 is also filled with the heat dissipation gel 62.

Next, an electrical connection of the semiconductor module 40 will be described below with reference to FIG. 3, which is a diagram illustrating the electrical connection.

Figure 3:
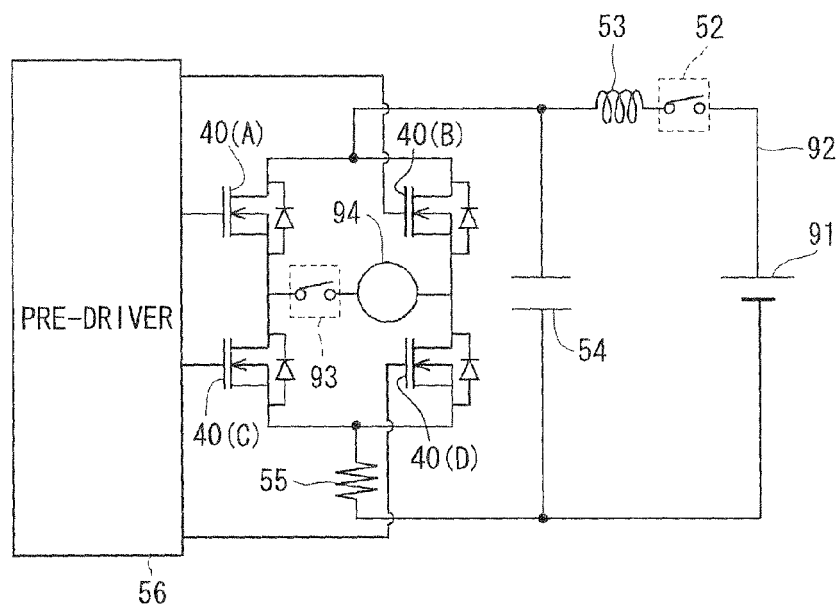
FIG. 3 is a diagram illustrating switching operation performed upon a motor in accordance with the first embodiment.

A power supply line 92 for a power source 91 is connected to the relay 52 via the connector 51 (not shown in FIG. 3). An electric current is supplied to the semiconductor module 40 via the coil 53, which is a choking coil for removing a noise of the power source 91.

Connections of the four semiconductor modules 40 will be described below with reference to FIG. 3. To distinguish the four semiconductor modules 40, the description will be given using alphabetical letters A to D in FIG. 3. In FIG. 3, the semiconductor module 40(A) and the semiconductor module 40(C) are connected in series, and the semiconductor module 40(B) and the semiconductor module 40(D) are connected in series.

The two semiconductor modules 40(A), 40(C), and the two semiconductor modules 40(B), 40(D) are connected in parallel. A relay 93 and a motor 94 are disposed between a connecting point of the semiconductor modules 40(A), 40(C), and a connecting point of the semiconductor modules 40(B), 40(D).

A shunt resistance 55 is provided on a ground side. The aluminum electrolytic capacitor 54 is connected between the power supply line and the ground in parallel with the power supply line and the ground. Surge voltage generated due to the turning on and off of the semiconductor module 40 is curbed by the aluminum electrolytic capacitor 54.

As a result of the above-described configuration of the circuit of FIG. 3, when the two semiconductor modules 40(A), 40(D) are turned on, and the two semiconductor modules 40(B), 40(C) are turned off, the electric current flows through the circuit in order of the semiconductor module 40(A), the relay 93, the motor 94, and the semiconductor module 40(D). Conversely, when the semiconductor modules 40(B), 40(C) are turned on, and the semiconductor modules 40(A), 40(D) are turned off, the electric current flows through the circuit in order of the semiconductor module 40(B), the motor 94, the relay 93, and the semiconductor module 40(C). Since the motor 94 is a direct-current (DC) motor, the motor 94 is rotated by the alternate turning on and off of the semiconductor modules 40 as above. A signal line from a pre-driver 56 is connected to a gate of each semiconductor module 40.

The semiconductor module 40 of the present embodiment will be described below in reference to FIGS. 4A to 4C.

The semiconductor module 40 includes a semiconductor chip 41, a resin portion 42 covering the chip 41, a heat dissipation portion 43 for releasing heat produced in the chip 41, and three terminals 44, 45, 46 bonded to the chip 41. The semiconductor chip 41 is disposed such that its upper surface is in contact with the heat dissipation portion 43. Accordingly, rapid conduction of heat from the semiconductor chip 41 to the heat dissipation portion 43 is achieved.

The resin portion 42 is formed such that the terminals 44 to 46 project from a lateral side of the resin portion 42. The three terminals 44 to 46 are, beginning at the top of FIG. 4A, a gate 44, a source 45, and a drain 46. The terminals 44 to 46 are bent downward, and the bottom of the resin portion 42 is on the substrate 20-side.

Figure 4A:
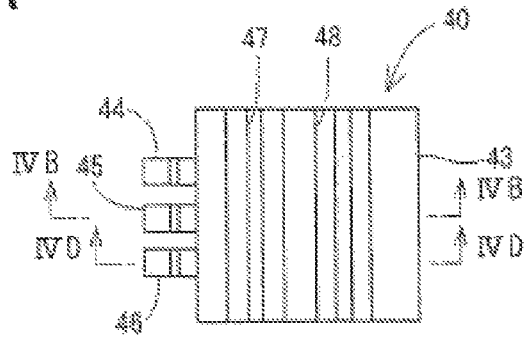
FIG. 4A is a top view illustrating a semiconductor module in accordance with the first embodiment.
Figure 4B:
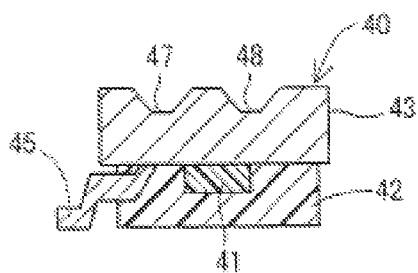
FIG. 4B is a cross-sectional view taken along a line IVB-IVB in FIG. 4A and illustrating the semiconductor module in accordance with the first embodiment.
Figure 4C:
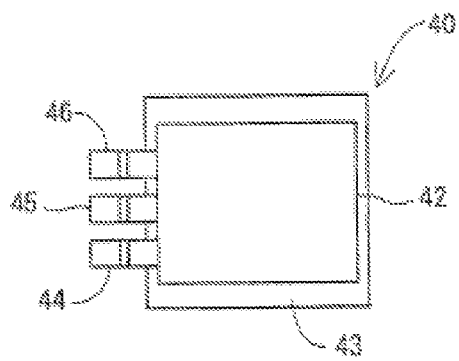
FIG. 4C is a bottom view illustrating the semiconductor module in accordance with the first embodiment.

As illustrated in FIG. 4C, the heat dissipation portion 43 has a greater width than the resin portion 42. More specifically, when a cross-sectional area of the semiconductor module 40 passing along a cross section perpendicular to upper and lower directions is considered, a cross-sectional area of the heat dissipation portion 43 is larger than a cross-sectional area of the resin portion 42. The heat dissipation portion 43 has a thickness of the resin portion 42 or larger. The heat dissipation portion 43 includes two elongated grooves 47, 48 on its upper surface. The source 45 of the terminals 44 to 46 is connected to the heat dissipation portion 43.

As described in detail above, in the semiconductor module 40 of the present embodiment, the source 45 is connected to the heat dissipation portion 43. Accordingly, even if the source 45 generates heat, rapid conduction of heat from the source 45 to the heat dissipation portion 43 is realized. As a result, heat dissipation performance of the module 40 improves.

In the semiconductor module 40, the heat dissipation portion 43 has a greater width than the resin portion 42 (see FIG. 4C). Because a surface area of the heat dissipation portion 43 is made larger in this manner, the heat dissipation performance of the module 40 improves.

In the semiconductor module 40, the two elongated grooves 47, 48 are formed on the upper surface of the heat dissipation portion 43 (see FIGS. 4A and 4B). Accordingly, the surface area of the heat dissipation portion 43 is made large, so that the heat dissipation performance of the module 40 improves. In addition, because the grooves 47, 48 serve as a resistance, displacement of the heat dissipation gel 61 is limited.

In the semiconductor module 40, the thickness of the heat dissipation portion 43 in the upper and lower directions is equal to or greater than the thickness of the resin portion 42 (see FIG. 4B). Accordingly, heat capacity of the heat dissipation portion 43 is made large, so that sufficient heat is released from the semiconductor chip 41.

Figure 4D:
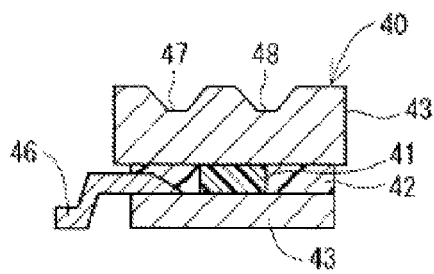
FIG. 4D is a cross-sectional view taken along a line IVD-IVD in FIG. 4A and illustrating a semiconductor module.

In the present embodiment, the source 45 is connected to the heat dissipation portion 43. Alternatively, the drain 46, instead of or in addition to the source 45, may be connected to the heat dissipation portion 43. FIG. 4D illustrates a connection between the drain 46 and heat dissipation portion 43. This is because it is highly possible that the source 45 and the drain 46, through which the high current flows, generate heat. If both the source 45 and the drain 46 are connected to the heat dissipation portion 43, two heat dissipation portions, which are insulated from each other, may be provided corresponding to both the terminals 45, 46 respectively. In this respect, the same holds for the following embodiments.

Figure 4E:
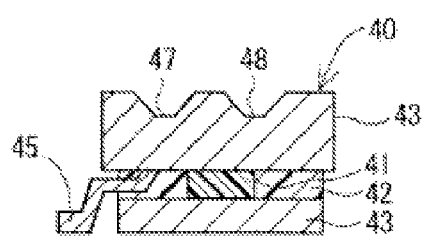
FIG. 4E is a cross-sectional view illustrating a semiconductor module.

FIG. 4D shows that the bottom portion of the heat dissipation portion 43 having two sidewalls being coplanar with two corresponding sidewall of the resin portion 42. FIGS. 4D & 4E illustrate that the heat dissipation portion 43 includes two heat dissipation portions 43 that are formed to be insulated from each other corresponding to the source terminal 45 and the drain terminal 46.

Second Embodiment

Figure 5A:
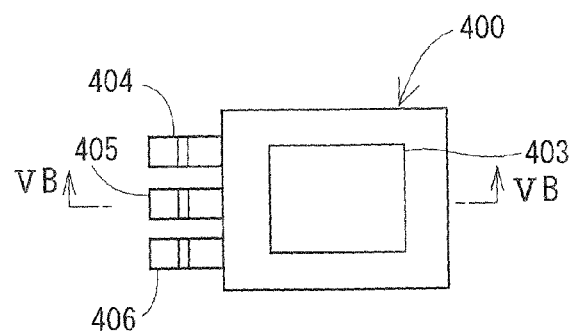
FIG. 5A is a top view illustrating a semiconductor module in accordance with a second embodiment of the invention.
Figure 5B:
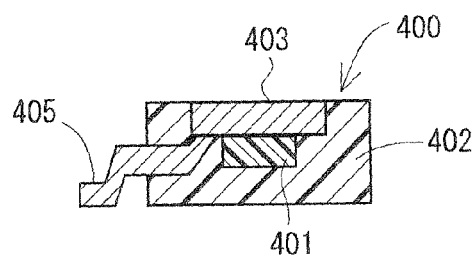
FIG. 5B is a cross-sectional view taken along a line VB-VB in FIG. 5A and illustrating the semiconductor module in accordance with the second embodiment.
Figure 5C:
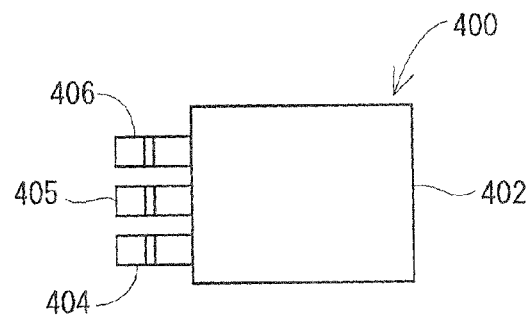
FIG. 5C is a bottom view illustrating the semiconductor module in accordance with the second embodiment.

A semiconductor module 400 of a second embodiment of the invention is illustrated in FIGS. 5A to 5C. Since configuration of an ECU is similar to the first embodiment, only configuration of the semiconductor module 400 will be described below.

The semiconductor module 400 includes a semiconductor chip 401, a resin portion 402 covering the chip 401, a heat dissipation portion 403 for releasing heat produced in the chip 401, and three terminals 404, 405, 406 bonded to the chip 401. The semiconductor chip 401 is disposed such that its upper surface is in contact with the heat dissipation portion 403. Accordingly, rapid conduction of heat from the semiconductor chip 401 to the heat dissipation portion 403 is achieved.

The resin portion 402 is formed such that the terminals 404 to 406 project from a lateral side of the resin portion 402. The three terminals 404 to 406 are, beginning at the top of FIG. 5A, a gate 404, a source 405, and a drain 406. The terminals 404 to 406 are bent downward, and the bottom of the resin portion 402 is on a substrate-side.

Similar to the first embodiment, the source 405 of the terminals 404 to 406 is connected to the heat dissipation portion 403.

In the semiconductor module 400 of the present embodiment, the source 405 is connected to the heat dissipation portion 403. Accordingly, even if the source 405 generates heat, rapid conduction of heat from the source 405 to the heat dissipation portion 403 is realized. As a result, heat dissipation performance of the module 400 improves.

Third Embodiment

Figure 6A:
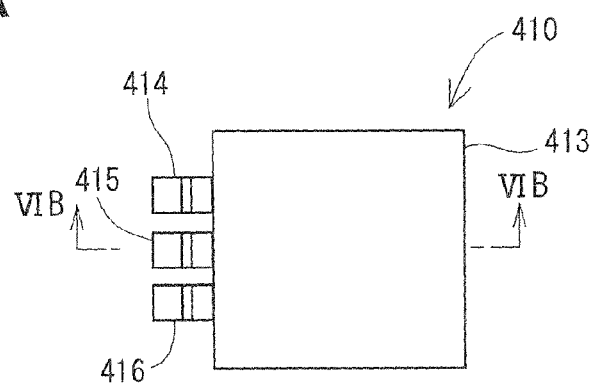
FIG. 6A is a top view illustrating a semiconductor module in accordance with a third embodiment of the invention.
Figure 6B:
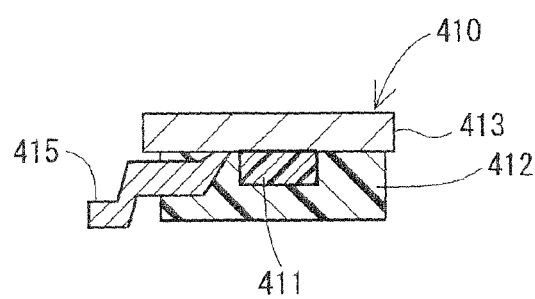
FIG. 6B is a cross-sectional view taken along a line VIB-VIB in FIG. 6A and illustrating the semiconductor module in accordance with the third embodiment.
Figure 6C:
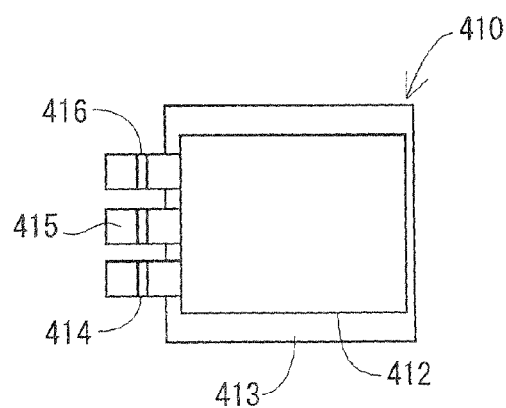
FIG. 6C is a bottom view illustrating the semiconductor module in accordance with the third embodiment.

A semiconductor module 410 of a third embodiment of the invention is illustrated in FIGS. 6A to 6C. Since configuration of an ECU is similar to the above embodiments, only configuration of the semiconductor module 410 will be described below.

The semiconductor module 410 includes a semiconductor chip 411, a resin portion 412 covering the chip 411, a heat dissipation portion 413 for releasing heat produced in the chip 411, and three terminals 414, 415, 416 bonded to the chip 411. The semiconductor chip 411 is disposed such that its upper surface is in contact with the heat dissipation portion 413. Accordingly, rapid conduction of heat from the semiconductor chip 411 to the heat dissipation portion 413 is achieved.

The resin portion 412 is formed such that the terminals 414 to 416 project from a lateral side of the resin portion 412. The three terminals 414 to 416 are, beginning at the top of FIG. 6A, a gate 414, a source 415, and a drain 416. The terminals 414 to 416 are bent downward, and the bottom of the resin portion 412 is on a substrate-side.

Similar to the above embodiments, the source 415 of the terminals 414 to 416 is connected to the heat dissipation portion 413. As illustrated in FIG. 6C, the heat dissipation portion 413 has a greater width than the resin portion 412. More specifically, when a cross-sectional area of the semiconductor module 410 passing along a cross section perpendicular to upper and lower directions is considered, a cross-sectional area of the heat dissipation portion 413 is larger than a cross-sectional area of the resin portion 412.

In the semiconductor module 410 of the present embodiment, the source 415 is connected to the heat dissipation portion 413. Accordingly, even if the source 415 generates heat, rapid conduction of heat from the source 415 to the heat dissipation portion 413 is realized. As a result, heat dissipation performance of the module 410 improves.

In the semiconductor module 410, the heat dissipation portion 413 has a greater width than the resin portion 412 (see FIG. 6C). Because a surface area of the heat dissipation portion 413 is made larger in this manner, the heat dissipation performance of the module 410 improves.

Fourth Embodiment

Figure 7A:
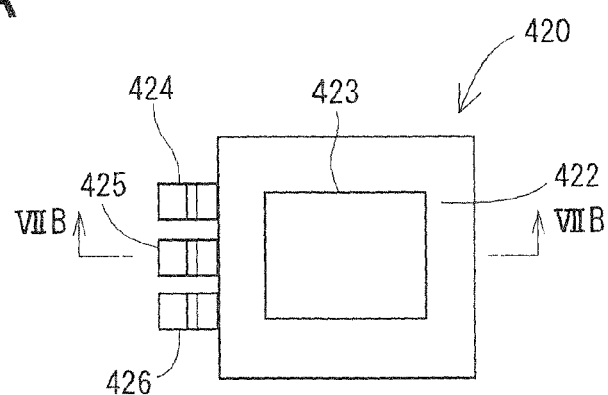
FIG. 7A is a top view illustrating a semiconductor module in accordance with a fourth embodiment of the invention.
Figure 7B:
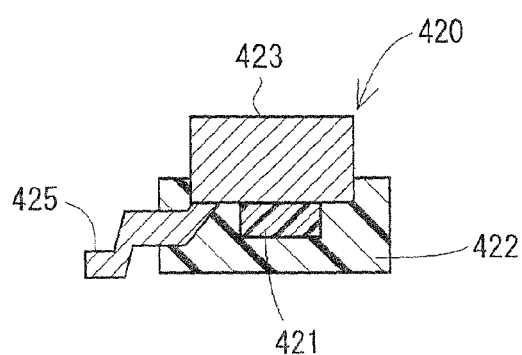
FIG. 7B is a cross-sectional view taken along a line VIIB-VIIB in FIG. 7A and illustrating the semiconductor module in accordance with the fourth embodiment.
Figure 7C:
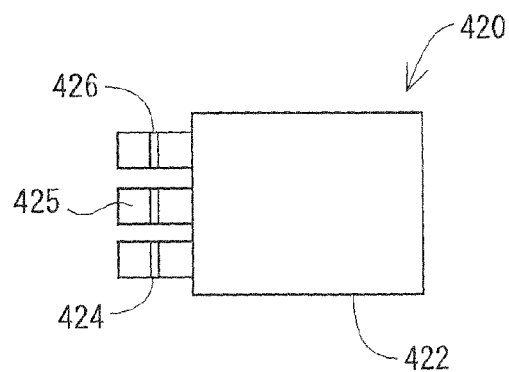
FIG. 7C is a bottom view illustrating the semiconductor module in accordance with the fourth embodiment.

A semiconductor module 420 of a fourth embodiment of the invention is illustrated in FIGS. 7A to 7C. Since configuration of an ECU is similar to the above embodiments, only configuration of the semiconductor module 420 will be described below.

The semiconductor module 420 includes a semiconductor chip 421, a resin portion 422 covering the chip 421, a heat dissipation portion 423 for releasing heat produced in the chip 421, and three terminals 424, 425, 426 bonded to the chip 421. The semiconductor chip 421 is disposed such that its upper surface is in contact with the heat dissipation portion 423. Accordingly, rapid conduction of heat from the semiconductor chip 421 to the heat dissipation portion 423 is achieved.

The resin portion 422 is formed such that the terminals 424 to 426 project from a lateral side of the resin portion 422. The three terminals 424 to 426 are, beginning at the top of FIG. 7A, a gate 424, a source 425, and a drain 426. The terminals 424 to 426 are bent downward, and the bottom of the resin portion 422 is on a substrate-side.

Similar to the above embodiments, the source 425 of the terminals 424 to 426 is connected to the heat dissipation portion 423. The heat dissipation portion 423 has a thickness of the resin portion 422 or larger in upper and lower directions.

In the semiconductor module 420 of the present embodiment, the source 425 is connected to the heat dissipation portion 423. Accordingly, even if the source 425 generates heat, rapid conduction of heat from the source 425 to the heat dissipation portion 423 is realized. As a result, heat dissipation performance of the module 420 improves.

In the semiconductor module 420, the thickness of the heat dissipation portion 423 in the upper and lower directions is equal to or greater than the thickness of the resin portion 422 (see FIG. 7B). Accordingly, heat capacity of the heat dissipation portion 423 is made large, so that sufficient heat is released from the semiconductor chip 421.

Fifth Embodiment

Figure 8A:
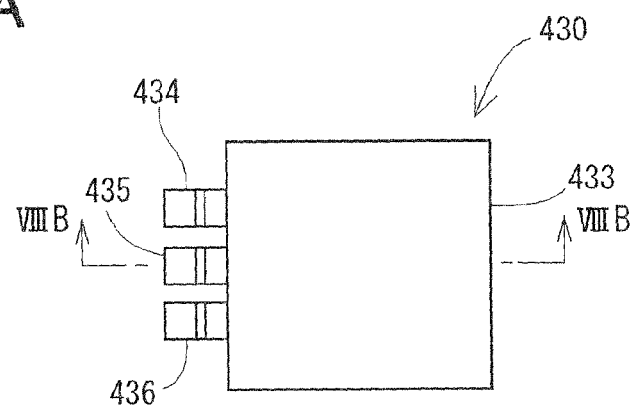
FIG. 8A is a top view illustrating a semiconductor module in accordance with a fifth embodiment of the invention.
Figure 8B:
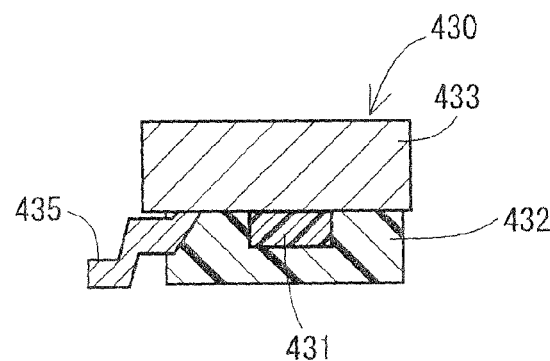
FIG. 8B is a cross-sectional view taken along a line VIIIB-VIIIB in FIG. 8A and illustrating the semiconductor module in accordance with the fifth embodiment.
Figure 8C:
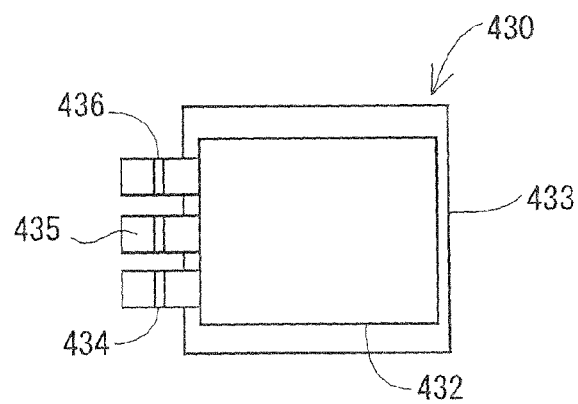
FIG. 8C is a bottom view illustrating the semiconductor module in accordance with the fifth embodiment.

A semiconductor module 430 of a fifth embodiment of the invention is illustrated in FIGS. 8A to 8C Since configuration of an ECU is similar to the above embodiments, only configuration of the semiconductor module 430 will be described below.

The semiconductor module 430 includes a semiconductor chip 431, a resin portion 432 covering the chip 431, a heat dissipation portion 433 for releasing heat produced in the chip 431, and three terminals 434, 435, 436 bonded to the chip 431. The semiconductor chip 431 is disposed such that its upper surface is in contact with the heat dissipation portion 433. Accordingly, rapid conduction of heat from the semiconductor chip 431 to the heat dissipation portion 433 is achieved.

The resin portion 432 is formed such that the terminals 434 to 436 project from a lateral side of the resin portion 432. The three terminals 434 to 436 are, beginning at the top of FIG. 8A, a gate 434, a source 435, and a drain 436. The terminals 434 to 436 are bent downward, and the bottom of the resin portion 432 is on a substrate-side.

Similar to the above embodiments, the source 435 of the terminals 434 to 436 is connected to the heat dissipation portion 433. As illustrated in FIG. 8C, the heat dissipation portion 433 has a greater width than the resin portion 432. More specifically, when a cross-sectional area of the semiconductor module 430 passing along a cross section perpendicular to upper and lower directions is considered, a cross-sectional area of the heat dissipation portion 433 is larger than a cross-sectional area of the resin portion 432. The heat dissipation portion 433 has a thickness of the resin portion 432 or larger in upper and lower directions.

In the semiconductor module 430 of the present embodiment, the source 435 is connected to the heat dissipation portion 433. Accordingly, even if the source 435 generates heat, rapid conduction of heat from the source 435 to the heat dissipation portion 433 is realized. As a result, heat dissipation performance of the module 430 improves.

In the semiconductor module 430, the heat dissipation portion 433 has a greater width than the resin portion 432 (see FIG. 8C). Because a surface area of the heat dissipation portion 433 is made larger in this manner, the heat dissipation performance of the module 430 improves.

In the semiconductor module 430, the thickness of the heat dissipation portion 433 in the upper and lower directions is equal to or greater than the thickness of the resin portion 432 (see FIG. 8B). Accordingly, heat capacity of the heat dissipation portion 433 is made large, so that sufficient heat is released from the semiconductor chip 431.

Sixth Embodiment

Figure 9A:
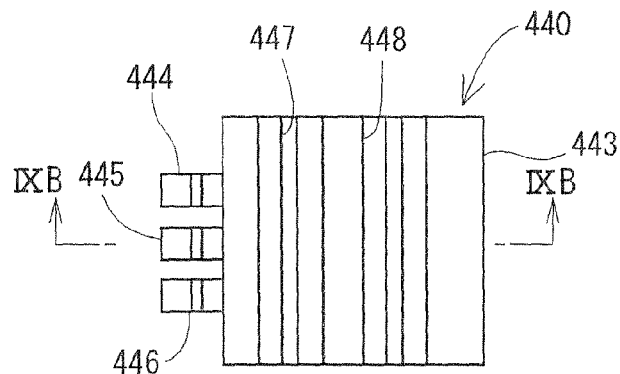
FIG. 9A is a top view illustrating a semiconductor module in accordance with a sixth embodiment of the invention.
Figure 9B:
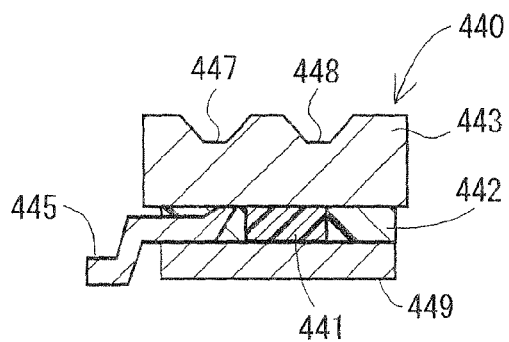
FIG. 9B is a cross-sectional view taken along a line IXB-IXB in FIG. 9A and illustrating the semiconductor module in accordance with the sixth embodiment.
Figure 9C:
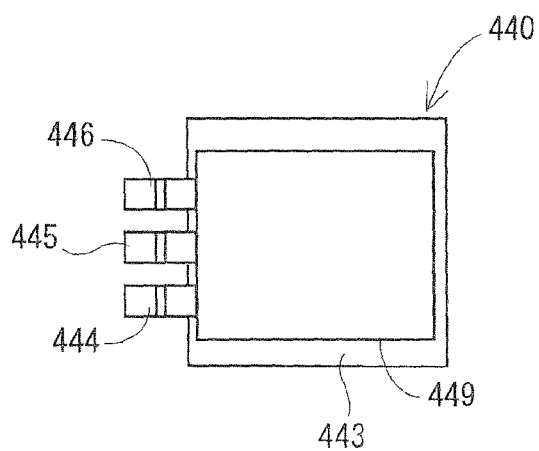
FIG. 9C is a bottom view illustrating the semiconductor module in accordance with the sixth embodiment.

A semiconductor module 440 of a sixth embodiment of the invention is illustrated in FIGS. 9A to 9C. Since configuration of an ECU is similar to the above embodiments, only configuration of the semiconductor module 440 will be described below.

The semiconductor module 440 includes a semiconductor chip 441, a resin portion 442 covering the chip 441, a heat dissipation portion 443 for releasing heat produced in the chip 441, and three terminals 444, 445, 446 bonded to the chip 441. The semiconductor chip 441 is disposed such that its upper surface is in contact with the heat dissipation portion 443. Accordingly, rapid conduction of heat from the semiconductor chip 441 to the heat dissipation portion 443 is achieved.

The resin portion 442 is formed such that the terminals 444 to 446 project from a lateral side of the resin portion 442. The three terminals 444 to 446 are, beginning at the top of FIG. 9A, a gate 444, a source 445, and a drain 446. The terminals 444 to 446 are bent downward, and the bottom of the resin portion 442 is on a substrate-side.

As illustrated in FIG. 9C, the heat dissipation portion 443 has a greater width than the resin portion 442. More specifically, when a cross-sectional area of the semiconductor module 440 passing along a cross section perpendicular to upper and lower directions is considered, a cross-sectional area of the heat dissipation portion 443 is larger than a cross-sectional area of the resin portion 442. The heat dissipation portion 443 has a thickness of the resin portion 442 or larger. The heat dissipation portion 443 includes two elongated grooves 447, 448 on its upper surface. The source 445 of the terminals 444 to 446 is connected to the heat dissipation portion 443.

Particularly, the semiconductor module 440 includes a heat conduction portion 449 on an undersurface of the resin portion 442. The heat conduction portion 449 is formed from high thermal conductive resin. The high thermal conductive resin is made, for example, by mixing filler of metal or inorganic ceramics that has high thermal conductivity into resin. Alternatively, a resin having high thermal conductivity may be employed as the resin into which the filler is mixed. As such a resin, for example, a resin using 4-(oxiranylmethoxy)benzoic acid-4,4'-[1,8-octanediylbis(oxy)] bisphenol ester as epoxy resin monomer, and a resin using 4,4'-diaminodiphenylmethane as an epoxy resin curing agent, may be employed.

In the semiconductor module 440 of the present embodiment, the source 445 is connected to the heat dissipation portion 443. Accordingly, even if the source 445 generates heat, rapid conduction of heat from the source 445 to the heat dissipation portion 443 is realized. As a result, heat dissipation performance of the module 440 improves.

In the semiconductor module 440, the heat dissipation portion 443 has a greater width than the resin portion 442 (see FIG. 9B). Because a surface area of the heat dissipation portion 443 is made larger in this manner, the heat dissipation performance of the module 440 improves.

In the semiconductor module 440, the two elongated grooves 447, 448 are formed on the upper surface of the heat dissipation portion 443 (see FIGS. 9A and 9B). Accordingly, the surface area of the heat dissipation portion 443 is made large, so that the heat dissipation performance of the module 440 improves. In addition, because the grooves 447, 448 serve as a resistance, displacement of a heat dissipation gel 61 is limited.

In the semiconductor module 440, the thickness of the heat dissipation portion 443 in the upper and lower directions is equal to or greater than the thickness of the resin portion 442 (see FIG. 9B). Accordingly, heat capacity of the heat dissipation portion 443 is made large, so that sufficient heat is released from the semiconductor chip 441.

The semiconductor module 440 includes the heat conduction portion 449 on the undersurface of the resin portion 442. Accordingly, heat is released toward the substrate-side as well, so that the heat dissipation performance of the module 440 further improves.

Additionally, needless to say, the heat dissipation portion 443 can also have a similar structure to the heat dissipation portions 403, 413, 423, 433 of the above embodiments. In this respect, the same holds for the following embodiments.

Seventh Embodiment

Figure 10A:
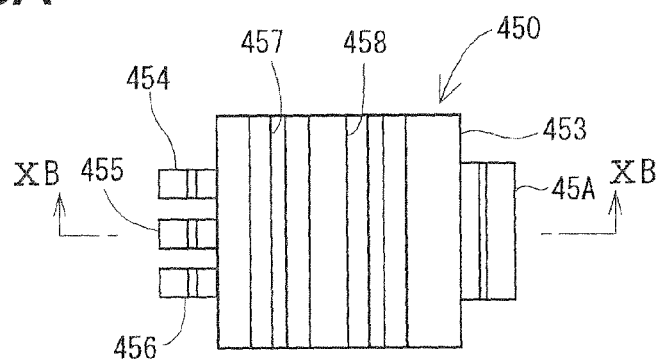
FIG. 10A is a top view illustrating a semiconductor module in accordance with a seventh embodiment of the invention.
Figure 10B:
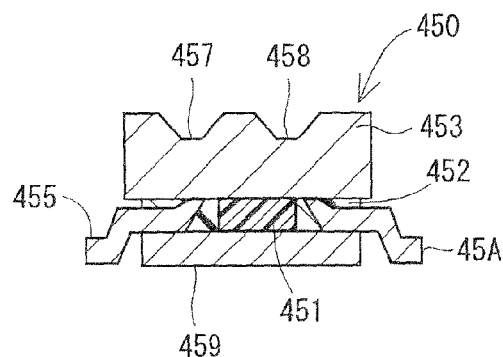
FIG. 10B is a cross-sectional view taken along a line XB-XB in FIG. 10A and illustrating the semiconductor module in accordance with the seventh embodiment.
Figure 10C:
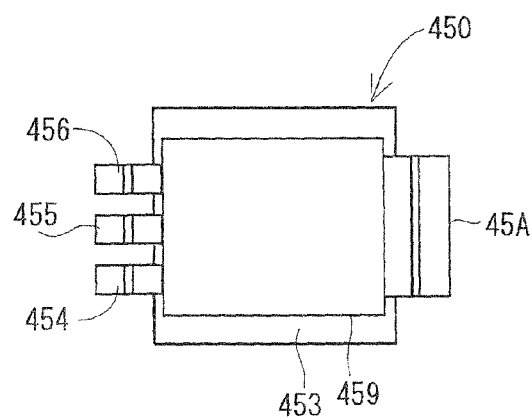
FIG. 10C is a bottom view illustrating the semiconductor module in accordance with the seventh embodiment.

A semiconductor module 450 of a seventh embodiment of the invention is illustrated in FIGS. 10A to 10C. Since configuration of an ECU is similar to the above embodiments, only configuration of the semiconductor module 450 will be described below.

The semiconductor module 450 includes a semiconductor chip 451, a resin portion 452 covering the chip 451, a heat dissipation portion 453 for releasing heat produced in the chip 451, and three terminals 454, 455, 456 bonded to the chip 451.

The heat dissipation portion 453 includes elongated grooves 457, 458, and a heat conduction portion 459 is provided on an undersurface of the resin portion 452. The above-described configurations of the module 450 are similar to the semiconductor module 440 of the sixth embodiment.

Particularly, as illustrated in FIGS. 10A to 10C, the semiconductor module 450 includes a lateral heat dissipation portion 45A that projects from the resin portion 452 toward the lateral side. The lateral heat dissipation portion 45A is made of a metallic material, and has a greater width than the terminals 454 to 456. The lateral heat dissipation portion 45A is connected to the heat dissipation portion 453. The heat dissipation portion 45A is bent downward to be soldered onto a substrate.

By means of the semiconductor module 450 as well, a similar effect to the semiconductor module 440 of the sixth embodiment is produced. In addition to this, the semiconductor module 450 includes the lateral heat dissipation portion 45A. Accordingly, heat dissipation performance of the module 450 further improves.

Eighth Embodiment

Figure 11A:
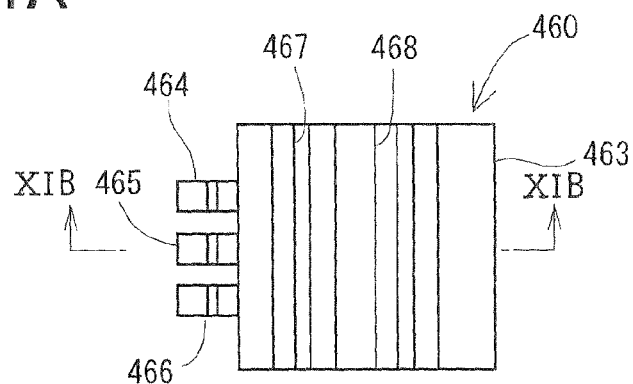
FIG. 11A is a top view illustrating a semiconductor module in accordance with an eighth embodiment of the invention.
Figure 11B:
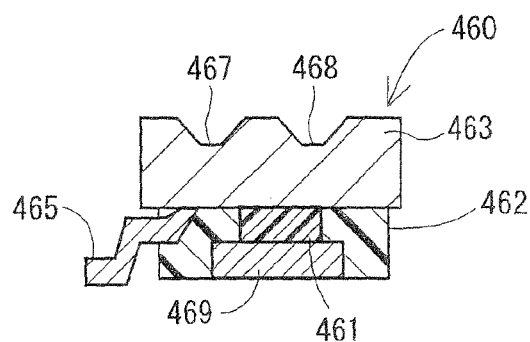
FIG. 11B is a cross-sectional view taken along a line XIB-XIB in FIG. 11A and illustrating the semiconductor module in accordance with the eighth embodiment.
Figure 11C:
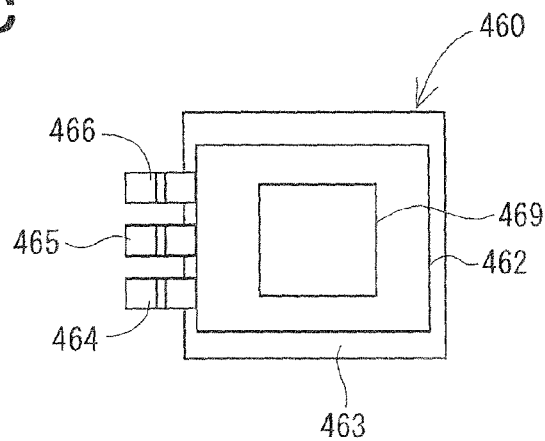
FIG. 11C is a bottom view illustrating the semiconductor module in accordance with the eighth embodiment.

A semiconductor module 460 of an eighth embodiment of the invention is illustrated in FIGS. 11A to 11C. Since configuration of an ECU is similar to the above embodiments, only configuration of the semiconductor module 460 will be described below.

The semiconductor module 460 includes a semiconductor chip 461, a resin portion 462 covering the chip 461, a heat dissipation portion 463 for releasing heat produced in the chip 461, and three terminals 464, 465, 466 bonded to the chip 461. The heat dissipation portion 463 includes elongated grooves 467, 468, and a heat conduction portion 469 is provided on an undersurface of the resin portion 462. The above-described configurations of the module 460 are similar to the semiconductor module 440 of the sixth embodiment.

Particularly, in the semiconductor module 460, the heat conduction portion 469 is made of a metallic material.

By means of the semiconductor module 460 as well, a similar effect to the semiconductor module 440 of the sixth embodiment is produced.

Ninth Embodiment

Figure 12A:
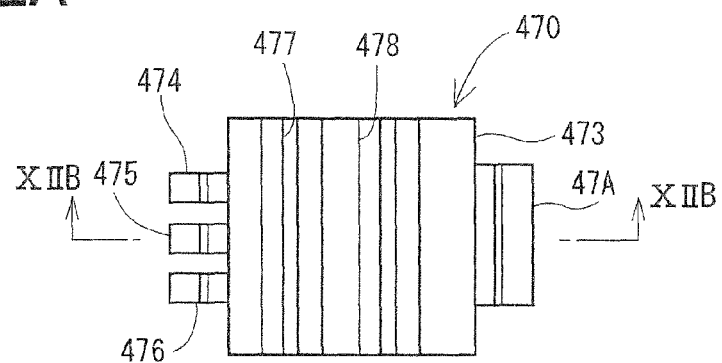
FIG. 12A is a top view illustrating a semiconductor module in accordance with a ninth embodiment of the invention.
Figure 12B:
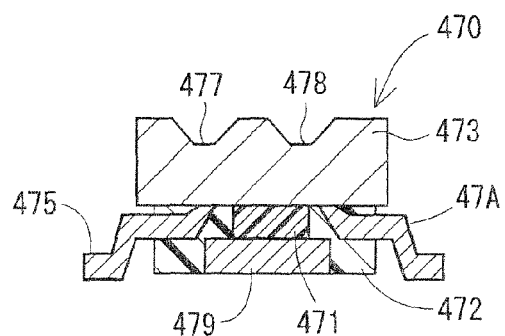
FIG. 12B is a cross-sectional view taken along a line XIIB-XIIB in FIG. 12A and illustrating the semiconductor module in accordance with the ninth embodiment.
Figure 12C:
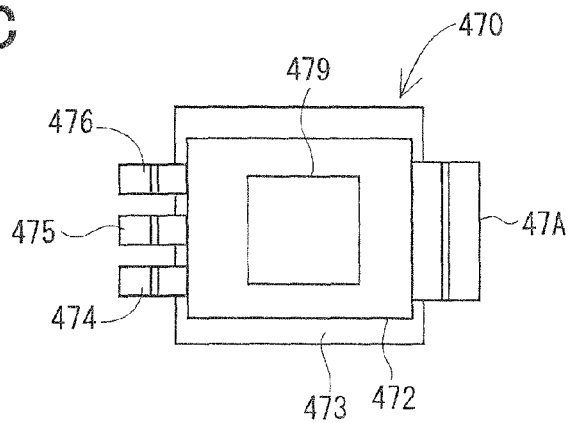
FIG. 12C is a bottom view illustrating the semiconductor module in accordance with the ninth embodiment.

A semiconductor module 470 of a ninth embodiment of the invention is illustrated in FIGS. 12A to 12C. Since configuration of an ECU is similar to the above embodiments, only configuration of the semiconductor module 470 will be described below.

The semiconductor module 470 includes a semiconductor chip 471, a resin portion 472 covering the chip 471, a heat dissipation portion 473 for releasing heat produced in the chip 471, and three terminals 474, 475, 476 bonded to the chip 471.

The heat dissipation portion 473 includes elongated grooves 477, 478, and a heat conduction portion 479 is provided on an undersurface of the resin portion 472.

The above-described configurations of the module 470 are similar to the semiconductor module 460 of the sixth embodiment.

Particularly, as illustrated in FIGS. 12A to 12C, the semiconductor module 470 includes a lateral heat dissipation portion 47A that projects from the resin portion 472 toward the lateral side. The lateral heat dissipation portion 47A is made of a metallic material, and has a greater width than the terminals 474 to 476. The lateral heat dissipation portion 47A is connected to the heat dissipation portion 473 inside the heat dissipation portion 473. The heat dissipation portion 47A is bent downward to be soldered onto a substrate.

By means of the semiconductor module 470 as well, a similar effect to the semiconductor module 460 of the sixth embodiment is produced. In addition to this, the semiconductor module 470 includes the lateral heat dissipation portion 47A. Accordingly, heat dissipation performance of the module 470 further improves.

Figure 13A:
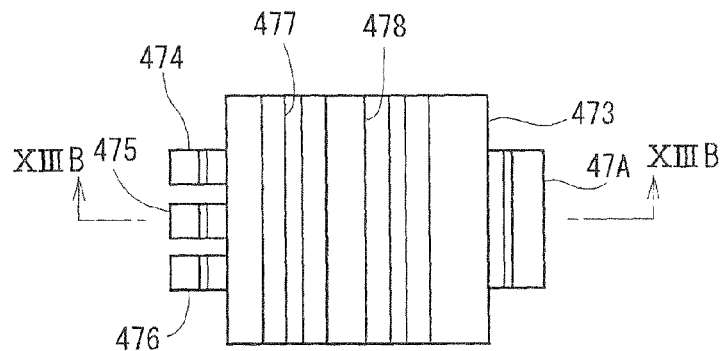
FIG. 13A is a top view illustrating a modification to the semiconductor module in accordance with the ninth embodiment.
Figure 13B:
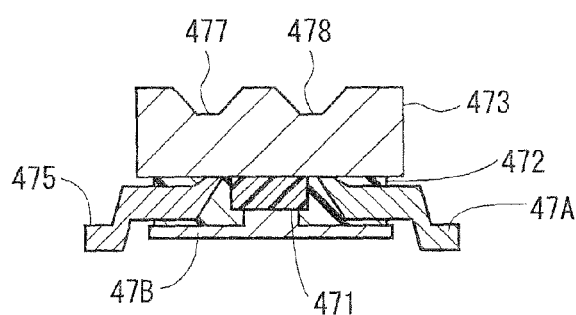
FIG. 13B is a cross-sectional view taken along a line XIIIB-XIIIB in FIG. 13A and illustrating the modification to the semiconductor module in accordance with the ninth embodiment.
Figure 13C:
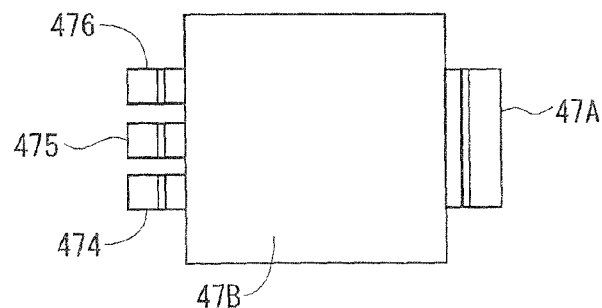
FIG. 13C is a bottom view illustrating the modification to the semiconductor module in accordance with the ninth embodiment.

In addition, as illustrated in FIGS. 13A to 13C, the module 470 may include a metal heat conduction portion 47B having a greater width. Accordingly, a surface area of the heat conduction portion 47B is made larger than the heat conduction portion 479, so that the heat dissipation performance of the module 470 further improves.

Tenth Embodiment

Figure 14A:
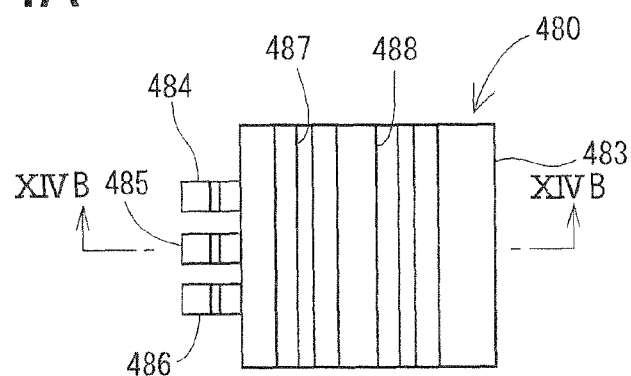
FIG. 14A is a top view illustrating a semiconductor module in accordance with a tenth embodiment of the invention.
Figure 14B:
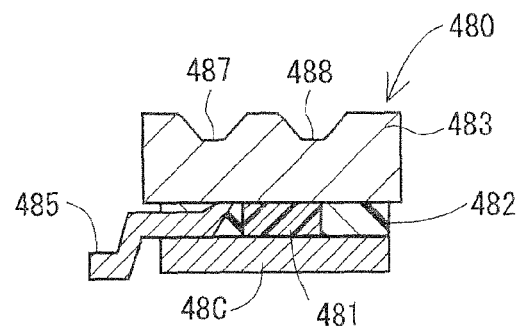
FIG. 14B is a cross-sectional view taken along a line XIVB-XIVB in FIG. 14A and illustrating the semiconductor module in accordance with the tenth embodiment.
Figure 14C:
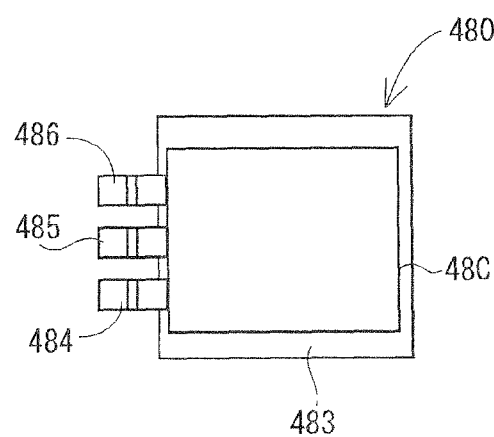
FIG. 14C is a bottom view illustrating the semiconductor module in accordance with the tenth embodiment.

A semiconductor module 480 of a tenth embodiment of the invention is illustrated in FIGS. 14A to 14C Since configuration of an ECU is similar to the above embodiments, only configuration of the semiconductor module 480 will be described below.

The semiconductor module 480 includes a semiconductor chip 481, a resin portion 482 covering the chip 481, a heat dissipation portion 483 for releasing heat produced in the chip 481, and three terminals 484, 485, 486 bonded to the chip 481. The heat dissipation portion 483 includes elongated grooves 487, 488. The above-described configurations of the module 480 are similar to the semiconductor module 440 of the sixth embodiment.

Particularly, the semiconductor module 480 includes a heat insulation portion 48C on an undersurface of the resin portion 482. Low thermal conductive resin may be used for the heat insulation portion 48C. For example, resin, such as polyphenylene sulfide (PPS), polyphenylene ether (PPE), melamine resin, polycarbonate (PC), polyethersulfone (PES), polysulfone (PSF), polyetherimide, polyimide, polyimide, polyamidoimide (PAI), acrylonitrile-styrene resin (AS resin), polypropylene (PP), polyethylene (PE), polymethylpentene (PMP), polyarylate (PAR), polyether ether ketone (PEEK), or polyetherketone (PEK), may be used for the heat insulation portion 48C.

By means of the semiconductor module 480 as well, a similar effect to the semiconductor module 440 of the sixth embodiment is produced. In addition, the semiconductor module 480 includes the heat insulation portion 48C on the undersurface of the resin portion 482. Accordingly, even if, for example, the semiconductor modules 480 are arranged adjacent to each other, the influence of heat transmitted via a substrate upon the modules 480 is inhibited.

Eleventh Embodiment

Figure 15A:
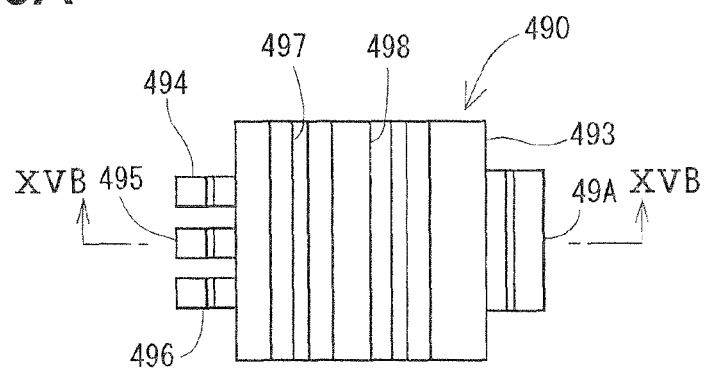
FIG. 15A is a top view illustrating a semiconductor module in accordance with an eleventh embodiment of the invention.
Figure 15B:
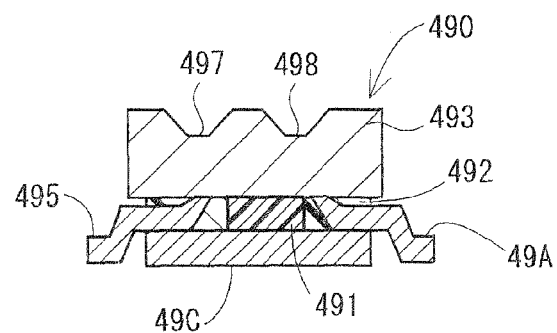
FIG. 15B is a cross-sectional view taken along a line XVB-XVB in FIG. 15A and illustrating the semiconductor module in accordance with the eleventh embodiment.
Figure 15C:
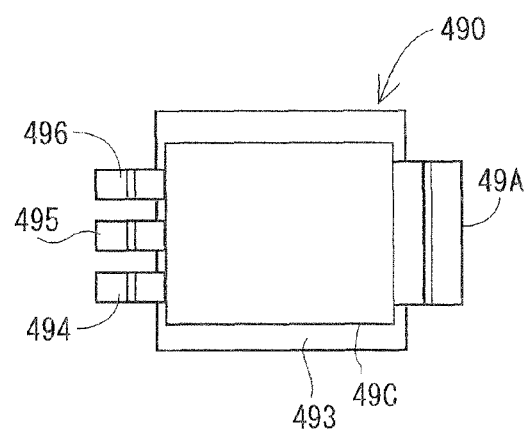
FIG. 15C is a bottom view illustrating the semiconductor module in accordance with the eleventh embodiment.

A semiconductor module 490 of an eleventh embodiment of the invention is illustrated in FIGS. 15A to 15C Since configuration of an ECU is similar to the above embodiments, only configuration of the semiconductor module 490 will be described below.

The semiconductor module 490 includes a semiconductor chip 491, a resin portion 492 covering the chip 491, a heat dissipation portion 493 for releasing heat produced in the chip 491, and three terminals 494, 495, 496 bonded to the chip 491.

The heat dissipation portion 493 includes elongated grooves 497, 498. The semiconductor module 490 includes a heat insulation portion 49C on an undersurface of the resin portion 492. The above-described configurations of the module 490 are similar to the semiconductor module 480 of the sixth embodiment.

Particularly, as illustrated in FIGS. 15A to 15C, the semiconductor module 490 includes a lateral heat dissipation portion 49A that projects from the resin portion 492 toward the lateral side. The lateral heat dissipation portion 49A is made of a metallic material, and has a greater width than the terminals 494 to 496. The lateral heat dissipation portion 49A is connected to the heat dissipation portion 493. The heat dissipation portion 49A is bent downward to be soldered onto a substrate.

By means of the semiconductor module 490 as well, a similar effect to the semiconductor module 480 of the sixth embodiment is produced. In addition to this, the semiconductor module 490 includes the lateral heat dissipation portion 49A. Accordingly, heat dissipation performance of the module 490 further improves. When the lateral heat dissipation portion 49A is soldered onto the substrate, a heat dissipation path that does not influence the other semiconductor modules 490 may be formed on the substrate.

In summary, a semiconductor module 40, 400, 410, 420, 430, 440, 450, 460, 470, 480, or 490 according to the above embodiments of the invention is adapted to be packaged on a substrate 20. The semiconductor module includes a semiconductor chip 41, 401, 411, 421, 431, 441, 451, 461, 471, 481, or 491, a resin portion 42, 402, 412, 422, 432, 442, 452, 462, 472, 482, or 492, a plurality of terminals 44-46; 404-406; 414-416; 424-426; 434-436; 444-446; 454-456; 464-466; 474-476; 484-486; or 494-496, and a heat dissipation portion 43, 403, 413, 423, 433, 443, 453, 463, 473, 483, or 493. The semiconductor chip 41, 401, 411, 421, 431, 441, 451, 461, 471, 481, or 491 has a switching function. The resin portion 42, 402, 412, 422, 432, 442, 452, 462, 472, 482, or 492 is formed to cover the semiconductor chip. The resin portion includes a first surface and a second surface, which are opposed to each other and expand generally parallel to an imaginary plane. The substrate 20 is located on a first surface-side of the resin portion. The plurality of terminals 44-46; 404-406; 414-416; 424-426; 434-436; 444-446; 454-456; 464-466; 474-476; 484-486; or 494-496 project from the resin portion in a direction of the imaginary plane and are soldered onto the substrate 20. The heat dissipation portion 43, 403, 413, 423, 433, 443, 453, 463, 473, 483, or 493 is disposed on a second surface-side of the resin portion to release heat generated in the semiconductor chip. One 45, 405, 415, 425, 435, 445, 455, 465, 475, 485, or 495 of the plurality of terminals is connected to the heat dissipation portion such that heat is transmitted from the one of the plurality of terminals to the heat dissipation portion.

When supplying a high current using the semiconductor module 40, 400, 410, 420, 430, 440, 450, 460, 470, 480, or 490, the high current flows through a particular terminal 45, 405, 415, 425, 435, 445, 455, 465, 475, 485, or 495. Therefore, not only the semiconductor chip 41, 401, 411, 421, 431, 441, 451, 461, 471, 481, or 491, but also the above terminal 45, 405, 415, 425, 435, 445, 455, 465, 475, 485, or 495 generates heat. Accordingly, in the embodiments of the invention, the particular terminal 45, 405, 415, 425, 435, 445, 455, 465, 475, 485, or 495 is connected to the heat dissipation portion 43, 403, 413, 423, 433, 443, 453, 463, 473, 483, or 493. As a result, the heat produced in the particular terminal 45, 405, 415, 425, 435, 445, 455, 465, 475, 485, or 495 is also transmitted to the heat dissipation portion 43, 403, 413, 423, 433, 443, 453, 463, 473, 483, or 493. Because of this, heat dissipation performance of the semiconductor module 40, 400, 410, 420, 430, 440, 450, 460, 470, 480, or 490 is improved as much as possible.

If there are more than one particular terminal, more than one heat dissipation portion, which are insulated from each other, may be provided corresponding to the more than one particular terminal, respectively.

An area of a section of the heat dissipation portion 43, 413, 433, 443, 453, 463, 473, 483, or 493 parallel to the imaginary plane may be equal to or larger than an area of a section of the resin portion 42, 412, 432, 442, 452, 462, 472, 482, or 492 parallel to the imaginary plane.

Accordingly, the surface area of the heat dissipation portion 43, 413, 433, 443, 453, 463, 473, 483, or 493 is made larger, so that even higher heat dissipation performance of the semiconductor module 40, 410, 430, 440, 450, 460, 470, 480, or 490 is shown.

A thickness of the heat dissipation portion 43, 423, 433, 443, 453, 463, 473, 483, or 493 in a direction perpendicular to the imaginary plane may be equal to or larger than a thickness of the resin portion 42, 422, 432, 442, 452, 462, 472, 482, or 492 in the direction perpendicular to the imaginary plane.

Accordingly, heat capacity of the heat dissipation portion 43, 423, 433, 443, 453, 463, 473, 483, or 493 is made larger, so that sufficient heat transferred from the semiconductor chip 41, 421, 431, 441, 451, 461, 471, 481, or 491 is released.

The heat dissipation portion 43, 443, 453, 463, 473, 483, or 493 may include an elongated groove 47, 48; 447, 448; 457, 458; 467, 468; 477, 478; 487, 488; or 497, 498 on a surface of the heat dissipation portion, which is on an opposite side of the heat dissipation portion from the second surface-side.

Accordingly, the surface area of the heat dissipation portion 43, 443, 453, 463, 473, 483, or 493 is made larger, so that even higher heat dissipation performance of the semiconductor module 40, 440, 450, 460, 470, 480, or 490 is shown. When the heat dissipation portion 43, 443, 453, 463, 473, 483, or 493 is covered with, for example, the heat dissipation gel 61, movement of the gel 61 is limited by elongated grooves 47, 48; 447, 448; 457, 458; 467, 468; 477, 478; 487, 488; or 497, 498.

Thus far, the configuration of the semiconductor module for releasing heat in the opposite direction from the substrate 20 has been described. Additionally, the resin portion 442, 452, 462, or 472 may include a heat conduction portion 449, 459, 469, 479, or 47B on the first surface-side of the resin portion; and the heat conduction portion releases heat toward the substrate 20. In this case, the heat conduction portion 449, 459, 469, 479, or 47B may be formed from thermal conductive resin. Alternatively, the heat conduction portion 449, 459, 469, 479, or 47B may be formed from a metallic material. Accordingly, heat is released in the direction of the substrate 20 as well, so that the heat dissipation performance of the semiconductor module 440, 450, 460, or 470 further improves.

Provided that the semiconductor modules are arranged adjacent to each other, for example, when heat is transmitted to a pattern of the substrate 20 by releasing heat toward the substrate 20, the semiconductor module may be influenced by the heat from the other modules. Accordingly, the resin portion 482, or 492 may include a heat insulation portion 48C or 49C on the first surface-side of the resin portion; and the heat insulation portion limits conduction of heat toward the substrate 20. As a result, the influence of the heat transmitted from the substrate 20 upon the semiconductor modules is restricted.

In addition to the upper surface side and the lower surface side of the resin portion, the resin portion 452, 472, or 492 may include a lateral heat dissipation portion 45A, 47A, or 49A, which projects from a lateral side of the resin portion that is located between the first surface and the second surface of the resin portion. For example, a plate-like metal member, which is connected to the semiconductor chip 451, 471, or 491, may be formed to project from a lateral side of the resin portion 452, 472, or 492. Accordingly, heat dissipation performance of the semiconductor module 450, 470, or 490 further improves.

Additional advantages and modifications will readily occur to those skilled in the art. The invention in its broader terms is therefore not limited to the specific details, representative apparatus, and illustrative examples shown and described.

What is claimed is:

1. A semiconductor module adapted to be packaged on a substrate, the semiconductor module comprising:
   a semiconductor chip that has a switching function;
   a resin portion that is formed to cover the semiconductor chip, wherein:
   the resin portion includes a first surface side and a second surface side, which are opposed to each other and extend generally in parallel to an imaginary plane; and
   the substrate is located on the first surface side of the resin portion;
   a gate terminal, a source terminal, and a drain terminal that are bonded to the semiconductor chip and project from the resin portion in a direction of the imaginary plane and that are soldered onto the substrate; and
   a heat dissipation portion that is disposed on the second surface side of the resin portion to release heat generated in the semiconductor chip, wherein:
   both the source terminal and the drain terminal are physically directly connected to the heat dissipation portion; and
   at least one particular terminal of the source terminal and the drain terminal is electrically connected directly to the heat dissipation portion,
   wherein the heat dissipation portion parallel to the imaginary plane has a cross-sectional area, and the resin portion parallel to the imaginary plane has a cross-sectional area, and
   wherein the cross-sectional area of the entire heat dissipation portion parallel to the imaginary plane is larger than the cross-sectional area of the entire resin portion parallel to the imaginary plane.

2. The semiconductor module according to claim 1, wherein a thickness of the heat dissipation portion in a direction perpendicular to the imaginary plane is equal to or larger than a thickness of the resin portion in the direction perpendicular to the imaginary plane.

3. The semiconductor module according to claim 1, wherein the heat dissipation portion includes an elongated groove on a surface of the heat dissipation portion, which is on an opposite side of the heat dissipation portion from the second surface side.

4. The semiconductor module according to claim 1, wherein the heat dissipation portion is formed from a metallic material.

5. The semiconductor module according to claim 1, wherein the gate terminal, the source terminal and the drain terminal are bonded to the semiconductor chip and project from a lateral side of the resin portion, and wherein the source terminal and the drain terminal are directly connected to the heat dissipation portion.

6. A semiconductor module adapted to be packaged on a substrate, the semiconductor module comprising:
 a semiconductor chip that has a switching function;
 a resin portion that is formed to cover the semiconductor chip, wherein:
 the resin portion includes a first surface side and a second surface side, which are opposed to each other and extend generally in parallel to an imaginary plane; and
 the substrate is located on the first surface side of the resin portion;
 a gate terminal, a source terminal, and a drain terminal that are bonded to the semiconductor chip and project from the resin portion in a direction of the imaginary plane and that are soldered onto the substrate; and
 a heat dissipation portion that is disposed on the second surface side of the resin portion to release heat generated in the semiconductor chip, wherein:
 at least one of the source terminal and the drain terminal is connectable to the heat dissipation portion; and
 at least one particular terminal of the source terminal and the drain terminal is electrically connected directly to the heat dissipation portion, wherein:
 the heat dissipation portion includes two heat dissipation portions that are formed to be insulated from each other corresponding to the source terminal and the drain terminal respectively; and
 the source terminal and the drain terminal are both physically directly connected to their corresponding heat dissipation portions,
 wherein the heat dissipation portion parallel to the imaginary plane has a cross-sectional area, and the resin portion parallel to the imaginary plane has a cross-sectional area, and
 wherein the cross-sectional area of the entire heat dissipation portion parallel to the imaginary plane is larger than the cross-sectional area of the entire resin portion parallel to the imaginary plane.

* * * * *